United States Patent
Dimashkie

(10) Patent No.: US 9,031,366 B2
(45) Date of Patent: May 12, 2015

(54) STABILIZED PUMP LASER OUTPUT SYSTEM AND METHOD

(75) Inventor: Bassam S. Dimashkie, Simi Valley, CA (US)

(73) Assignee: Northrop Grumman Guidance and Electronic Company, Inc., Woodland Hills, CA (US)

( * ) Notice: Subject to any disclaimer, the term of this patent is extended or adjusted under 35 U.S.C. 154(b) by 274 days.

(21) Appl. No.: 13/614,293

(22) Filed: Sep. 13, 2012

(65) Prior Publication Data

US 2014/0071455 A1    Mar. 13, 2014

(51) Int. Cl.
| | |
|---|---|
| G02B 6/34 | (2006.01) |
| G01C 19/72 | (2006.01) |
| H01S 5/065 | (2006.01) |
| H01S 5/022 | (2006.01) |
| H01S 5/024 | (2006.01) |
| H01S 5/14 | (2006.01) |

(52) U.S. Cl.
CPC ......... *G01C 19/721* (2013.01); *Y10T 29/49826* (2013.01); *H01S 5/02248* (2013.01); *H01S 5/02284* (2013.01); *H01S 5/02415* (2013.01); *H01S 5/02438* (2013.01); *H01S 5/0652* (2013.01); *H01S 5/0656* (2013.01); *H01S 5/146* (2013.01)

(58) Field of Classification Search
None
See application file for complete search history.

(56) References Cited

U.S. PATENT DOCUMENTS

| | | |
|---|---|---|
| 5,659,559 A | 8/1997 | Ventrudo et al. |
| 5,870,417 A | 2/1999 | Verdiell et al. |
| 6,246,816 B1 | 6/2001 | Moore et al. |
| 6,704,338 B2 | 3/2004 | Yoshida |
| 6,760,151 B1 | 7/2004 | Vail et al. |
| 7,899,105 B1 * | 3/2011 | Hargis et al. .................. 372/102 |
| 2002/0118715 A1 | 8/2002 | Kimura et al. |
| 2002/0122454 A1 | 9/2002 | Nasu et al. |
| 2003/0161379 A1 | 8/2003 | Wolak et al. |
| 2004/0033021 A1 | 2/2004 | Oguri et al. |
| 2005/0123012 A1 | 6/2005 | Hayamizu et al. |
| 2005/0220163 A1 | 10/2005 | Okuta et al. |
| 2006/0251425 A1 * | 11/2006 | Kupershmidt et al. ....... 398/147 |
| 2009/0074014 A1 * | 3/2009 | Liu .................................... 372/6 |
| 2012/0177319 A1 * | 7/2012 | Alemohammad et al. ...... 385/12 |
| 2014/0198317 A1 * | 7/2014 | Qiu et al. ...................... 356/460 |

FOREIGN PATENT DOCUMENTS

| | | |
|---|---|---|
| EP | 1 387 197 A1 | 2/2004 |
| EP | 1 617 244 A1 | 1/2006 |

OTHER PUBLICATIONS

European Search Report for corresponding EP13181882.5-1564, dated Jan. 7, 2014.
European Extended Search Report for corresponding EP13181882. 5-1564, dated May 8, 2014.
Japanese Office Action corresponding JP 2013-184864, dated Sep. 5, 2014.

* cited by examiner

*Primary Examiner* — Sung Pak
(74) *Attorney, Agent, or Firm* — Tarolli, Sundheim, Covell & Tummino LLP

(57) ABSTRACT

A system includes a light source that generates a coherent output signal. A light stabilizer comprising an optical fiber can be configured to pass one axis of propagation of the coherent output signal from the light source to a Bragg grating to generate a stabilized pump output signal for the system.

19 Claims, 7 Drawing Sheets

STABILIZED PUMP LASER OUTPUT SYSTEM AND METHOD

TECHNICAL FIELD

The present invention relates generally to optics, and more particularly to a system and method for generating a stabilized pump laser output.

BACKGROUND

A laser source pump is a device to generate coherent light for use by various systems. Laser pumping is the act of energy transfer from an external source into the gain medium of a laser, wherein energy is absorbed in the medium, producing excited states in its atoms. When the number of particles in one excited state exceeds the number of particles in the ground state or a less-excited state, population inversion is achieved. In this condition, the mechanism of stimulated emission can take place and the medium can act as a laser or an optical amplifier. The pump energy is usually provided in the form of light or electric current.

Such laser pump sources are often utilized in accordance with a gyroscope for positioning systems, for example. A major requirement for such lasers is to be able to generate a consistent wavelength over a vast temperature range (e.g., −60 to 90 deg C.). Past attempts at achieving such stability have involved the use of polarization-maintaining (PM) optical fiber that was excited by a laser diode. The PM fiber was difficult to stabilize however as multiple propagation modes could be launched in the fiber that cause transmission inefficiencies.

SUMMARY

In an aspect of the invention, a laser pump system is provided. A system includes a light source that generates a coherent output signal. A light stabilizer comprising an optical fiber can be configured to pass one axis of propagation of the coherent output signal from the light source to a Bragg grating to generate a stabilized pump output signal for the system.

In another aspect of the invention, a method includes etching a Bragg grating into an optical fiber. The method includes coupling the optical fiber to a coherent light source. The method also includes generating a stabilized pump output signal by configuring the Bragg grating and the optical fiber to pass one axis of propagation from the coherent light source.

In yet another aspect of the invention, a system includes a light source that generates a coherent output signal. The system includes a light stabilizer comprising an optical fiber configured to pass one axis of propagation of the coherent output signal from the light source to a Bragg grating to generate a stabilized pump output signal for the system. The system also includes a substrate coupled to the light source to provide temperature stability for the light source.

DETAILED DESCRIPTION

Systems and methods for generating stabilized pump laser output are provided. In one example, the present invention is directed to providing wavelength and temperature stability for a laser source pump system. Such laser sources are often utilized in accordance with a gyroscope for positioning systems, for example. One example of such a laser source can be a 1480 nm InGaAsP laser. A typical requirement for such lasers is to be able to generate a consistent wavelength over a large temperature range (e.g., −60 to 90 deg C.). Past attempts at achieving such stability have involved the use of polarization-maintaining (PM) optical fiber that was excited by a laser diode, however, such techniques were capable of launching unwanted propagation modes which reduced the efficiency of transmissions.

The present invention mitigates unwanted propagation modes by utilizing a light stabilizer at the output of a coherent light source. The light stabilizer includes an optical fiber configured to pass one axis of propagation of the coherent output signal from the light source to a Bragg grating to generate a stabilized pump output signal for the system. In one example, the light stabilizer can include a single mode fiber etched with a fiber Bragg grating which utilizes a single axis of propagation to minimize transmission problems. Also, the single mode fiber can be brought into contact with a temperature stabilizer (e.g., thermoelectric cooling (TEC) device) to facilitate temperature stability in the generated optical wavelength. In another example, the light stabilizer can include a polarizing fiber that can be employed in conjunction with the Bragg grating to generate a stabilized laser pump output signal.

Figure 1:
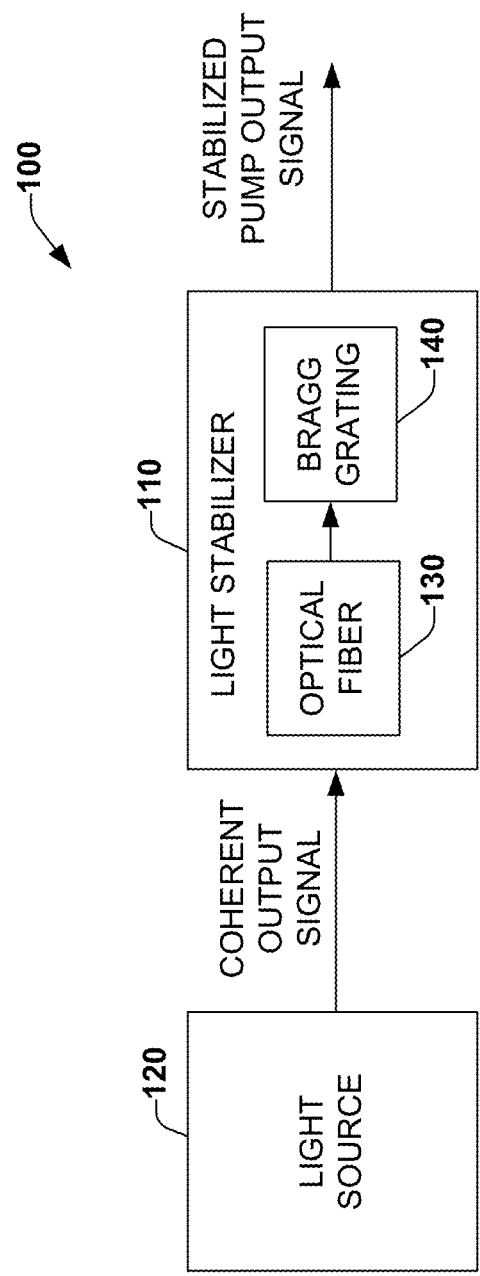
FIG. 1 illustrates a schematic block diagram of a laser pump system that employs a light stabilizer to generate a stabilized pump output signal in accordance with an aspect of the present invention.

FIG. 1 illustrates a laser pump system 100 that employs a light stabilizer 110 to generate a stabilized pump output signal in accordance with an aspect of the present invention. The system 100 includes a light source 120 that generates a coherent output signal that is applied to the light stabilizer 110. The light stabilizer 110 includes an optical fiber 130 configured to pass one axis of propagation of the coherent output signal from the light source 110 to a Bragg grating 140 to generate a stabilized pump output signal for the system 100. In one example, the optical fiber 130 can be a single mode fiber that is configured with the Bragg grating 140 to pass the single axis of propagation of the coherent output signal from the light source 120. In another example, the optical fiber 130 can be a polarizing fiber configured to pass the single axis of propagation of the coherent output signal from the light source 120.

In previous systems, a Polarizing Maintaining (PM) fiber and grating were coupled to a laser diode to form a laser source pump and light transmission system. The PM fiber did not offer suitable rejection of unwanted propagation frequencies or modes in the pump output signal, however. In essence, when a PM fiber is used and attached to the laser diode source, some frequencies may be applied to a desired axis of propagation and some are inadvertently transmitted in an unwanted axis of propagation. The axis can be referred to as fast and slow axis of propagation caused by birefringence of the PM material. When frequencies are applied to both axis however, undesired phase shifts and source power degradations can be observed leading to instability in the pump output signal.

The light stabilizer 110 employs a single mode fiber in one example or a polarizing fiber in another example to mitigate propagation of frequencies in multiple axis of the respective optical material. The single mode fiber and Bragg grating 140 provides a single axis of propagation thus mitigating the fast and slow axis transmission problems described herein. One aspect of single mode fiber however is to provide temperature stability to the fiber in order to properly utilize the single mode fiber. Thus, the single mode fiber can be mounted inside a respective laser cavity on a thermoelectric cooling device to provide such stability as will be illustrated and described below with respect to FIGS. 2 and 3.

In another example, the optical fiber 130 can be a polarizing fiber coupled to the Bragg grating 140. Such polarizing fiber and grating 140 solves the mixed propagation issues by providing a rejection of the undesired propagation mode (at the connection point to the laser diode) which is not provided by the PM fiber and grating. Such rejection increases the efficiency of the source pump and mitigates phase mixing problems during transmission. Such polarizing fiber and grating configuration are illustrated and described below with respect to FIG. 5.

Figure 2:
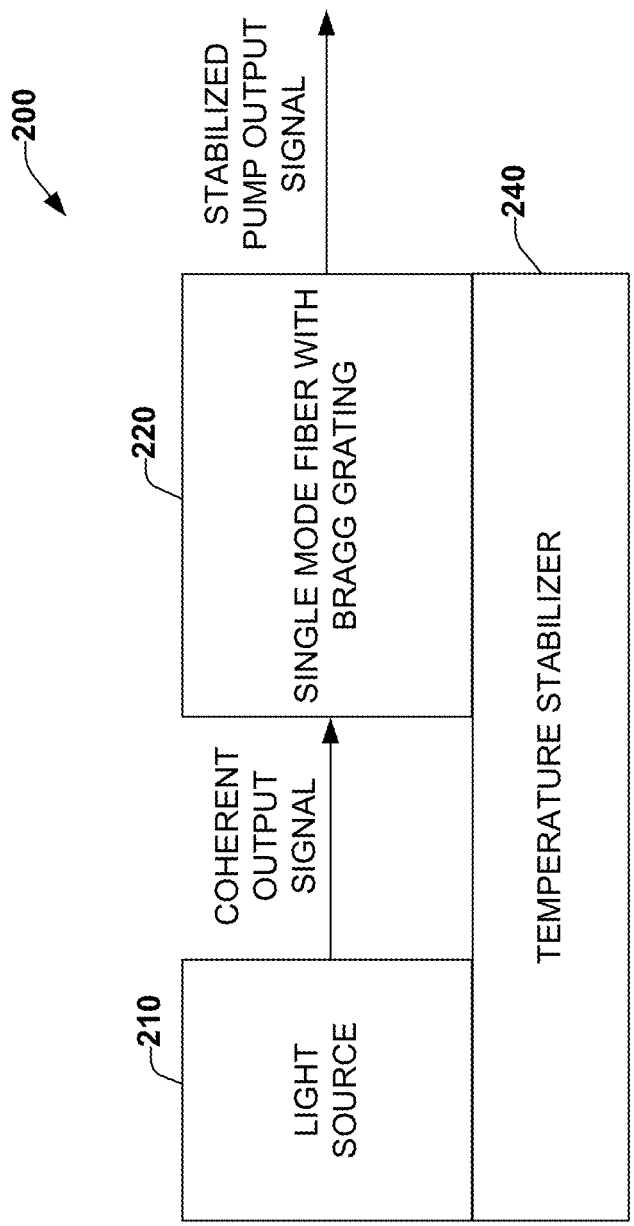
FIG. 2 illustrates a schematic block diagram of a laser pump system in accordance with an aspect of the present invention.

FIG. 2 illustrates a schematic block diagram of a laser pump system 200 in accordance with an aspect of the present invention. The system 200 includes a light source 210 to generate a coherent output signal. A single mode fiber 220 (e.g., fiber optic material) having an etched Bragg grating receives the coherent output signal from the light source 210 and generates a stabilized pump output signal for the system 200. The system 200 also includes a temperature stabilizer 240 to provide temperature stability for the light source 210 and the single mode fiber 220. The temperature stabilizer 240 can be coupled to the light source 210 and the single mode fiber 220 as a substrate material, for example. As will be illustrated and described below with respect to FIG. 3, the single mode fiber 220 can have a surface material that is metalized at least at one portion of the surface material (e.g., at two points along the fiber) to facilitate mechanical and wavelength stability within the fiber. The metalized portion of the surface material of the single mode fiber 220 can be soldered to the substrate material of the temperature stabilizer 240. In one specific example, the temperature stabilizer 240 can be a thermoelectric cooler although other cooling techniques are possible (e.g., liquid or chemical cooling).

To facilitate wavelength stability, the etched Bragg grating can be positioned at a length that exceeds the decoherence length of the pump laser (e.g., about 3.8 mm to about 4 mm away from the light source 210 which will be illustrated below with respect to FIG. 2.) The single mode fiber 220 can also include a lensed tip to couple to the light source 210. As noted previously, in one example the light source 210 can be a 1480 nanometer wavelength laser diode source. Other wavelengths are possible, however, such as operating within a wavelength range from about 300 nanometers to about 4000 nanometers. As will be described and illustrated below with respect to FIG. 4, the stabilized pump output signal can be employed to drive a fiber optic gyroscope, in one example application for the laser pump system 200.

When applying the laser pump system 200 to a fiber optic gyroscopic (FOG) system, scale factor stability of the FOG is generally proportional to the source wavelength stability. The wavelength stability of a broadband fiber source can be limited by the power and wavelength stability of the pump laser. The system 200 provides a pump laser output with improved power and wavelength stability over a large temperature range and thus results in improved FOG scale factor stability. In previous attempts to stabilize such systems, stabilized pump laser configurations utilized a spliced polarization maintaining (PM) fiber that was outside of the laser package. The birefringent nature of PM fiber can induce temperature dependent phase delays between the orthogonal propagation axes of the fiber, which results in optical interference. The introduction of a temperature sensitive interferometer between the primary and external laser cavity can result in sinusoidal fluctuations in output power as well as the potential for a mode collapse, sometimes referred to as Mode Hopping. The laser pump system 200 prevents the introduction of an interferometer within the laser cavity, which suppresses temperature sensitive power and wavelength variations. The temperature stabilization of the grating can result in a more stable Bragg wavelength resulting in additional wavelength stability. As will be illustrated below with respect to FIG. 2, the single mode fiber can be metalized in multiple locations and subsequently coupled to the substrate 240 at such locations to further promote mechanical and wavelength stability within the fiber.

The following list provides but a few example types and wavelengths for light sources 210. Such lights sources can include: 375 nm, 405 nm—InGaN blue-violet laser, 445 nm—InGaN blue laser, 473 nm—blue laser, 485 nm, 510 nm—(to ~525 nm) green, 635 nm—AlGaInP, 640 nm—red, 657 nm—AlGaInP, 670 nm—AlGaInP, 760 nm—AlGaInP, 785 nm—GaAlAs, 808 nm—GaAlAs pumps in DPSS Nd:YAG lasers, 848 nm, 980 nm—InGaAs pump for optical amplifiers, for Yb:YAG DPSS lasers, 1064 nm—AlGaAs fiber-optic communication, DPSS laser pump frequency, 1310 nm—InGaAsP, InGaAsN fiber-optic communication, 1480 nm—InGaAsP pump for optical amplifiers, 1512 nm—InGaAsP, 1550 nm—InGaAsP, InGaAsNSb fiber-optic communication, 1625 nm—InGaAsP fiber-optic communication, 1654 nm—InGaAsP, 1877 nm—GaSbAs, 2004 nm—GaSbAs, 2330 nm—GaSbAs, 2680 nm—GaSbAs, 3030 nm—GaSbAs, and 3330 nm—GaSbAs, for example.

The fiber Bragg grating (FBG) 230 is a type of distributed Bragg reflector constructed in a short segment of optical fiber that reflects particular wavelengths of light and transmits all others. This is achieved by creating a periodic variation in the refractive index of the fiber core, which generates a wavelength specific dielectric mirror. The fiber Bragg grating 230 can therefore be used as an inline optical filter to block certain wavelengths, or as a wavelength-specific reflector. The Bragg gratings 230 can be created by "inscribing" or "writing" systematic (periodic or aperiodic) variation of refractive index into the core of an optical fiber using an intense ultraviolet (UV) source such as a UV laser. Two example processes utilizing the UV laser source include interference and masking to produce the Bragg grating 230.

Figure 3:
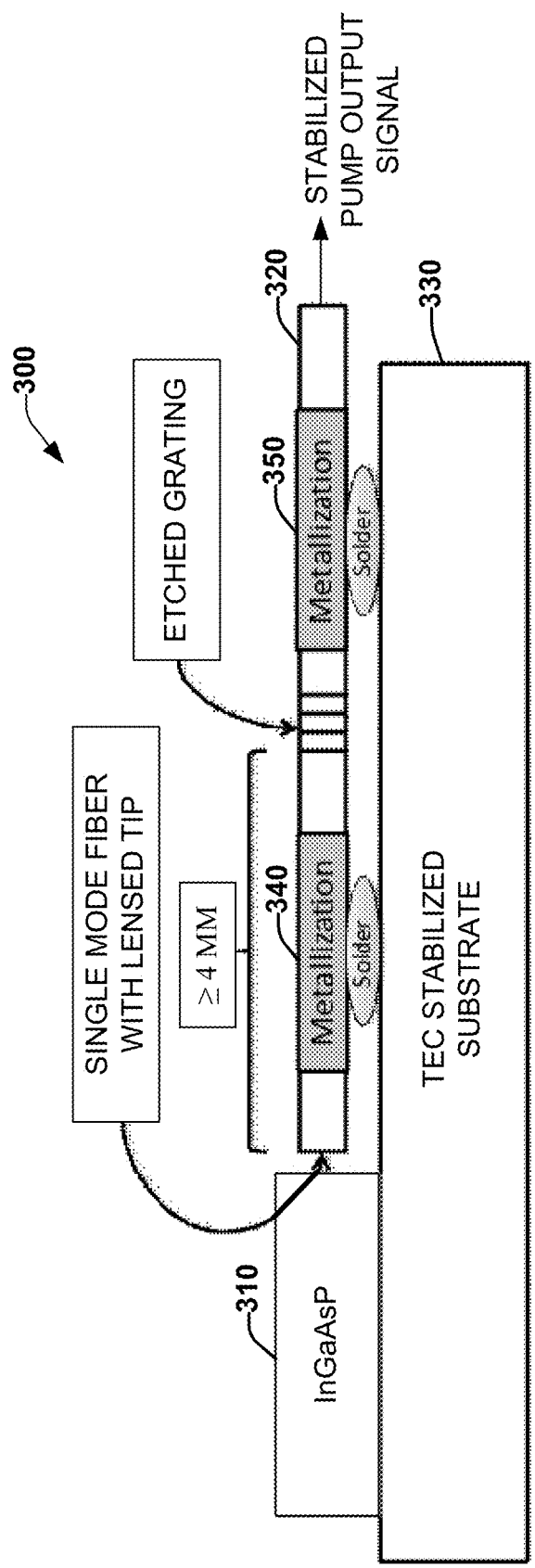
FIG. 3 illustrates an example of a laser pump system that employs single mode fiber with an etched grating and a thermoelectric cooled substrate in accordance with an aspect of the present invention.

FIG. 3 illustrates an example of a laser pump system 300 that employs single mode fiber with an etched grating and a thermoelectric cooled substrate in accordance with an aspect of the present invention. In the example system 300, an InGaAsP light source 310 drives a single mode fiber 320, wherein the light source and single mode fiber are attached to a thermoelectric cooler (TEC) substrate 330. As shown, metallization points 340 and 350 can be added to the surface of the single mode fiber 320 and attached to the TEC substrate 340 via solder, for example. The single mode fiber 320 can be shorter than the substrate 330, cut to about the same length as the substrate, or it can protrude past the substrate. An etched grating is produced in the single mode fiber 320 and positioned at a length that exceeds the decoherence length of the pump laser and from where the single mode fiber and light source 310 are coupled. The coupling point between the light source 310 and the single mode fiber 320 can be achieved via a lensed tip on the single mode fiber, for example.

Figure 4:
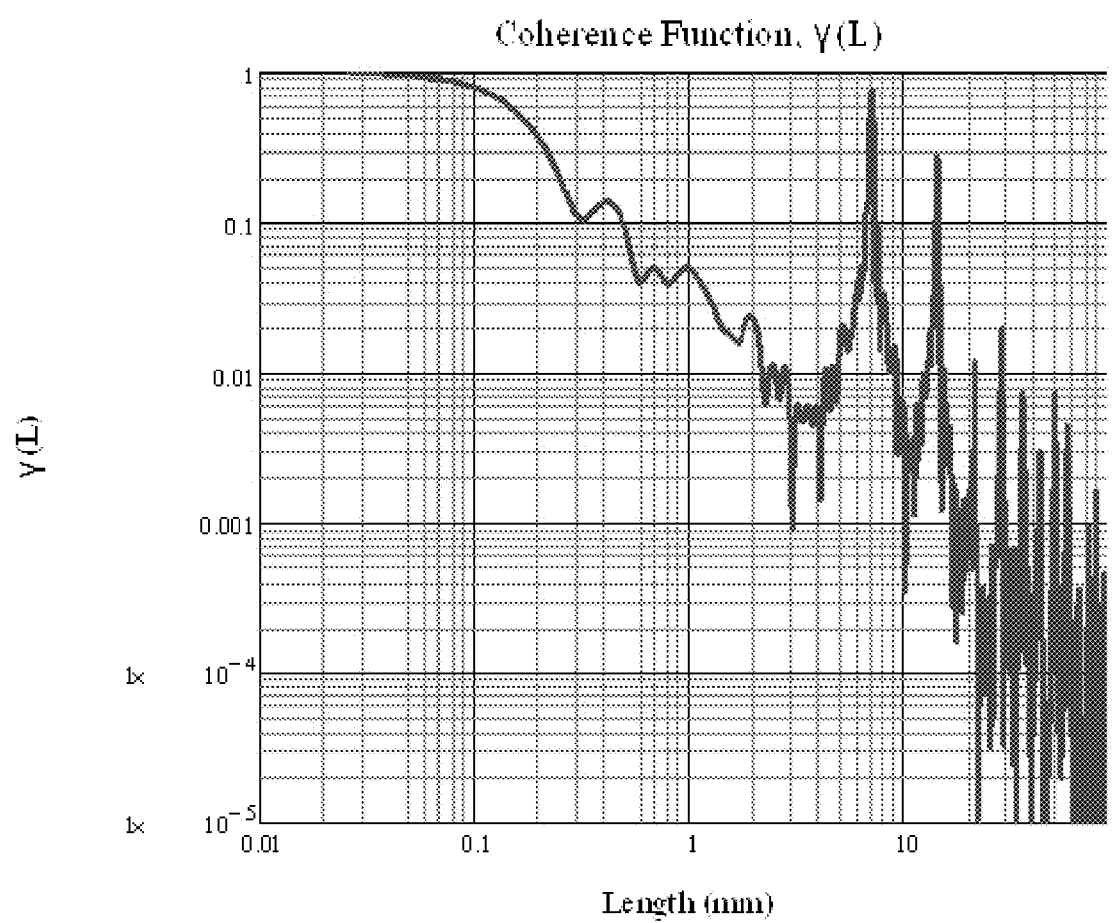
FIG. 4 illustrates an example coherence function in accordance with an aspect of the present invention.

The spacing of the etched grating on the single mode fiber 320 from the light source 310 is provided to address mode competition, wherein the introduction of an external reflection can result in mode competition between the primary laser cavity and the newly formed external cavity with the single mode fiber. In order to prevent such a competition, it is desired to ensure that the secondary cavity length is sufficiently long such that any reflections within the external cavity are substantially decoherent, wherein the decoherence length is dependent on the spectral structure exiting the primary laser cavity. For instance, the decoherence length of a 1 mm InGaAsP laser can be read from the coherence function, as illustrated in FIG. 4. Reading from the graph in FIG. 4, an optical path length difference (OPD) greater than 11 mm should suppress interference terms by at least 17 dB. In order to obtain an 11 mm OPD in a fused silica core fiber, for example, it is desirable to ensure that the grating distance is greater than about 3.8 mm, for example.

The TEC substrate 330 can employ thermoelectric cooling that uses the Peltier effect to create a heat flux between the junction of two different types of materials. A Peltier cooler, heater, or thermoelectric heat pump is a solid-state active heat pump which transfers heat from one side of the device to the other, with consumption of electrical energy, depending on the direction of the current. Such an instrument is also referred to as a Peltier device, Peltier heat pump, solid state refrigerator, or thermoelectric cooler (TEC). The Peltier device is thus a heat pump: when direct current runs through it, heat is moved from one side to the other. As noted previously, other types of cooling are also possible.

Figure 5:
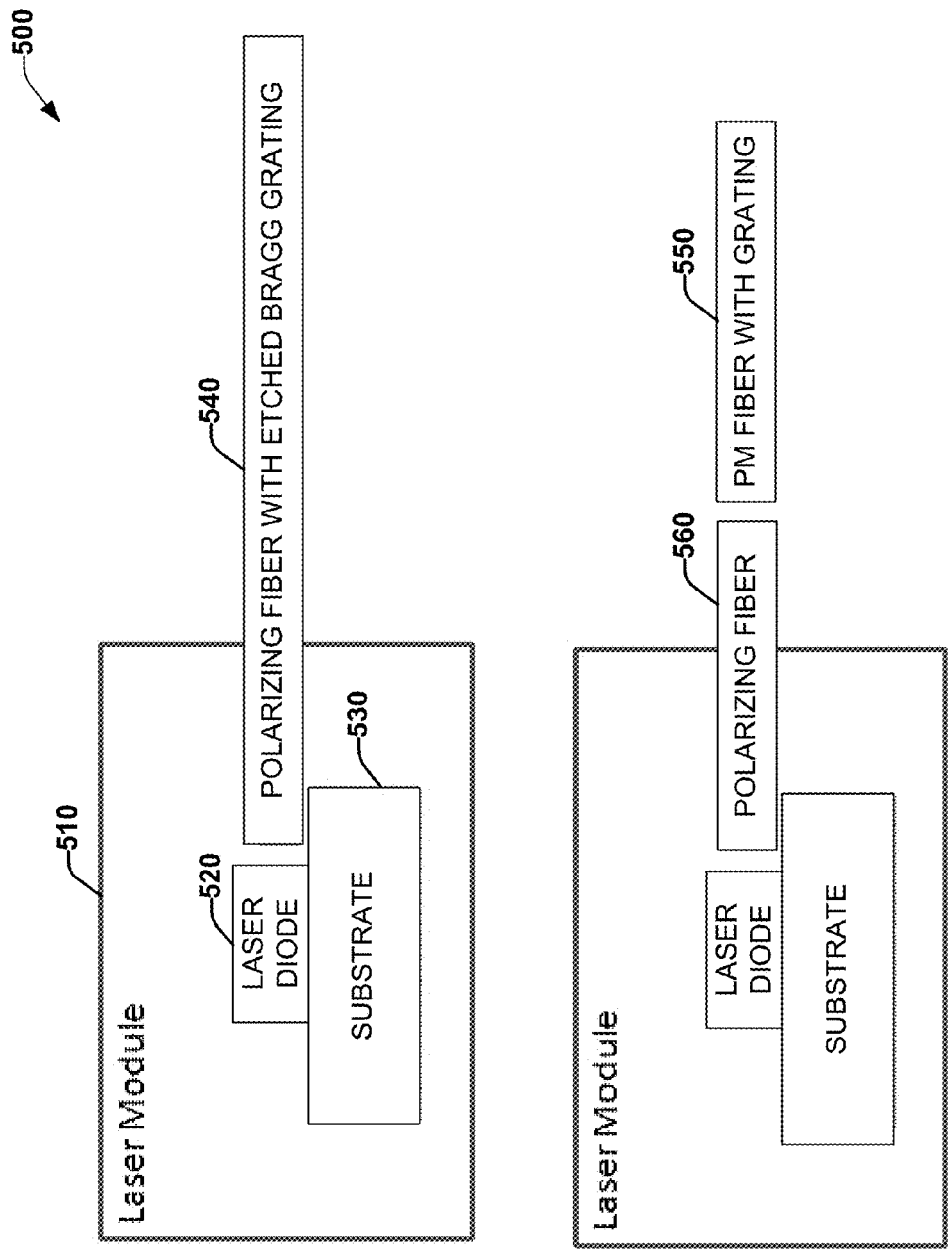
FIG. 5 illustrates an alternative example of a laser pump system in accordance with an aspect of the present invention.

FIG. 5 illustrates an alternative example of a laser pump system 500 in accordance with an aspect of the present invention. In one example, the system 500 utilizes a laser module 510 having a laser diode 520 mounted on a substrate 530 (e.g., thermo cooled substrate). The laser diode 530 is then coupled to a polarizing fiber 540 having an etched Bragg grating. The use of polarizing fiber and grating 540 can result in a reduction in the optical power fluctuation proportional to the quality of extinction ratio of the polarizing fiber used. For example, a polarizing fiber segment with a −3 dB extinction ratio can result in a factor of two reduction in intensity sinusoids when compared to a high birefringence PM fiber of conventional systems.

The polarizing fiber 540 can be comprised of a fiber which maintains the optical polarization state of the propagating light as well as rejecting light of the incorrect polarization state. A fiber Bragg grating can then be directly etched to the polarizing fiber as shown at 540. Since the external cavity (polarizing fiber segment) rejects unwanted polarization, the polarization extinction ratio (PER) of the laser to fiber coupling can be relaxed with no substantial degradation to performance. More specifically, a degradation in the laser to fiber coupling PER can result in power reduction, but the external cavity would no longer act as an interferometer due to birefringence variations over temperature or other environmental condition resulting in a stable optical power and wavelength. In another example, a separate FBG etched onto a polarizing maintaining (PM) fiber segment 550 can be spliced to the polarizing fiber element shown at 560.

Figure 6:
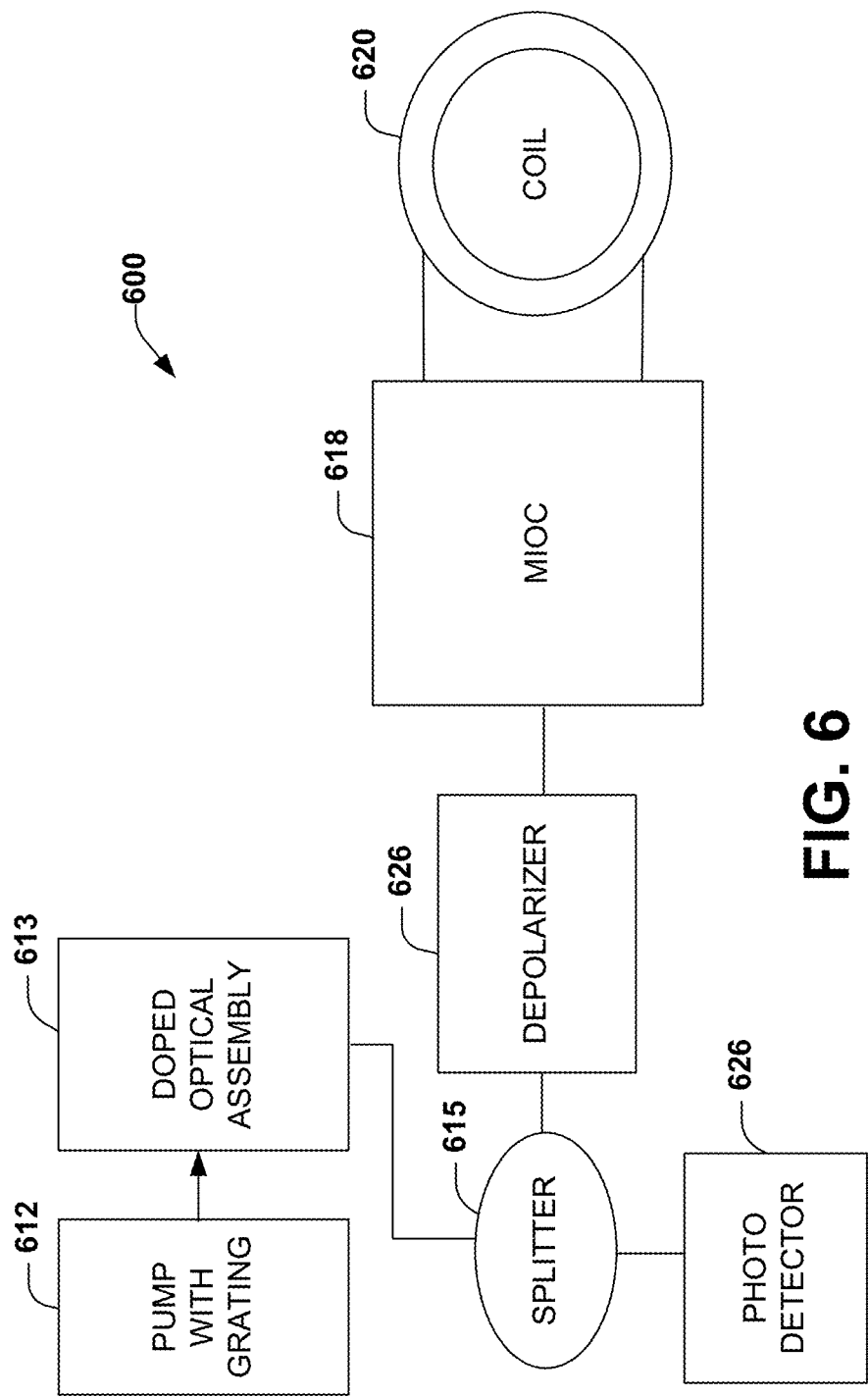
FIG. 6 illustrates a schematic block diagram of a laser pump system that utilizes a light source driving a light stabilizer and employed as part of a fiber optic gyroscope in accordance with an aspect of the present invention.

FIG. 6 illustrates a schematic block diagram of a laser pump system 600 that utilizes a pump with grating 612 (e.g., similar to system 100 of FIG. 1 above) driving a doped optical assembly 613 and employed as part of a fiber optic gyroscope in accordance with an aspect of the present invention. The system 600 can be configured as an interferometric fiber optic gyroscope (FOG) and includes an optical signal light source 612 that provides counter-propagating waves to a fiber optic sensing coil 620. Output from the pump 610 is fed to the doped optical assembly 613 which can include doped fiber, a wavelength division multiplexor, and an optical isolator, for example. Within the system 600, a multifunction integrated optic chip (MIOC) 618 is connected to the fiber optic sensing coil 620.

A typical MIOC in a FOG system 600 includes components such as polarizers, phase modulators and a Y-coupler that are used in processing and controlling optical signals input to and from the fiber optic sensing coil 620. The output of the system 600 is the phase difference between two counter-propagating waves. The rotation rate of the coil about its sensing axis is obtained by dividing this phase difference by a scale factor of the FOG, referred to as the Sagnac scale factor. As shown, output from the optical assembly 613 can be fed to an optical splitter 615 which drives a depolarizer 624 and feeds a photo detector 626.

The scale factor stability of fiber optic gyroscopes (FOGs) is affected by changes in the polarization state of the light in the fiber between the optical source and the MIOC 618. Changes in stress within the fiber can cause the polarization sate of light guided by the fiber to change. This stress may be mechanical or thermal in origin. The depolarizer 624 (e.g., Lyot depolarizer) can be placed in the optical path between the optical source 612 and the MIOC 618 to adjust the polarization state for the optical light source signal as it propagates through the FOG.

Figure 7:
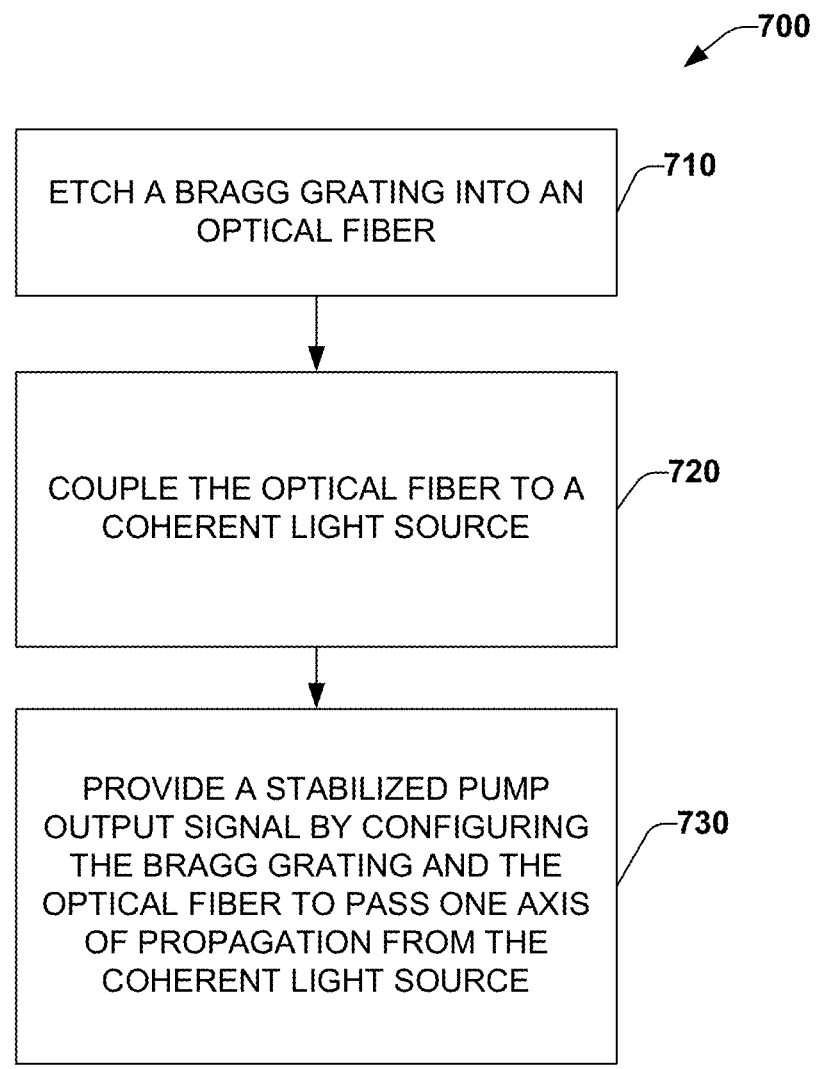
FIG. 7 illustrates a methodology for generating a pump laser output in accordance with an aspect of the present invention.

In view of the foregoing structural and functional features described above, an example method will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders and/or concurrently from that shown and described herein. Moreover, it is not necessary that all described actions be performed to implement a method.

FIG. 7 illustrates a methodology 700 for generating a pump laser output in accordance with an aspect of the present invention. At 710, the method 700 includes etching a Bragg grating into an optical fiber (e.g., single mode fiber or polarizing fiber). As noted previously, such etching can be applied by an ultraviolet source via masking and/or interference processes. At 720, the method 700 includes coupling the optical fiber to a coherent light source. At 730, the method 700 includes providing a stabilized pump output signal by configuring the Bragg grating and the optical fiber to pass one axis of propagation from the coherent light source. The method 700 can also include etching the Bragg grating into a single mode fiber to pass the one axis of propagation from the coherent light source. This can include applying the single mode fiber to a thermoelectric cooler to facilitate temperature stability in the single mode fiber. The method 700 can also include applying the stabilized pump output signal to a fiber optic gyroscope. In another aspect, the method 700 can include etching the Bragg grating into a polarizing fiber to pass the one axis of propagation from the coherent light source. In yet another example, the optical fiber can include a polarizing fiber that is coupled to a polarizing maintaining fiber having a Bragg grating to pass the one axis of propagation of the coherent light source.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

Having described the invention, the following is claimed:

1. A system comprising:
   a light source that generates a coherent output signal; and
   a light stabilizer comprising an optical fiber configured to pass one axis of propagation of the coherent output signal from the light source to a Bragg grating located in the optical fiber at a distance from the light source that exceeds a decoherence length of the light source to generate a stabilized pump output signal for the system.

2. The system of claim 1, wherein the optical fiber is a single mode fiber that operates with the Bragg grating to pass the one axis of propagation of the coherent output signal.

3. The system of claim 2, further comprising a temperature stabilizer to provide temperature stability for the light source and the single mode fiber.

4. The system of claim 3, wherein the temperature stabilizer is coupled to the light source and the single mode fiber as a substrate material.

5. The system of claim 4, wherein the single mode fiber has a surface material that is metalized at least at one portion of the surface material.

6. The system of claim 2, wherein the temperature stabilizer is a thermoelectric cooler.

7. The system of claim 1, wherein the light source operates within a wavelength range from about 300 nanometers to about 4000 nanometers.

8. The system of claim 1, wherein the optical fiber further comprises a polarizing fiber that operates with the Bragg grating to pass the one axis of propagation of the coherent output signal.

9. The system of claim 1, wherein the optical fiber further comprises a polarizing fiber that is coupled to a polarizing maintaining fiber having a Bragg grating to pass the one axis of propagation of the coherent output signal.

10. A fiber optic gyroscope comprising the system of claim 1, a coil, and a multifunction integrated optic chip (MIOC) that couples the system of claim 1 to the coil.

11. A method comprising:
    etching a Bragg grating into an optical fiber;
    coupling the optical fiber to a coherent light source; and
    providing a stabilized pump output signal by configuring the Bragg grating at a distance from the light source that exceeds a decoherence length of the light source and the optical fiber to pass one axis of propagation from the coherent light source.

12. The method of claim 11, further comprising etching the Bragg grating into a single mode fiber to pass the one axis of propagation from the coherent light source.

13. The method of claim 12, further comprising applying the single mode fiber to a thermoelectric cooler to facilitate temperature stability in the single mode fiber.

14. The method of claim 11, further comprising applying the stabilized pump output signal to a fiber optic gyroscope.

15. The method of claim 11, further comprising etching the Bragg grating into a polarizing fiber to pass the one axis of propagation from the coherent light source.

16. The method of claim 11, wherein the optical fiber further comprises a polarizing fiber that is coupled to a polarizing maintaining fiber having a Bragg grating to pass the one axis of propagation of the coherent light source.

17. A system comprising:
    a light source that generates a coherent output signal;
    an optical fiber coupled to the light source having a given portion of metalized surface material located between the Bragg grating and the light source and another portion of metalized surface material located beyond the Bragg grating opposite the given portion;
    a light stabilizer comprising the optical fiber configured to pass one axis of propagation of the coherent output signal from the light source to a Bragg grating to generate the stabilized pump output signal for the system; and
    a substrate coupled to the light source and the optical fiber at each of the metalized portions to provide temperature stability for the light source.

18. The system of claim 17, wherein optical fiber is a single mode fiber and the substrate is a thermoelectric cooler to provide temperature stability for the single mode fiber.

19. The system of claim 17, wherein the optical fiber further comprises a polarizing fiber that operates with the Bragg grating to pass the one axis of propagation of the coherent output signal.

* * * * *